(12) United States Patent
Lu et al.

(10) Patent No.: US 8,995,102 B2
(45) Date of Patent: Mar. 31, 2015

(54) DISPLAY AND ELECTROSTATIC DISCHARGE PROTECTION APPARATUS

(71) Applicant: Wistron Corporation, New Taipei (TW)

(72) Inventors: Kuo-Cheng Lu, New Taipei (TW); Wen-Cheng Chang, New Taipei (TW)

(73) Assignee: Wistron Corporation, New Taipei (TW)

( * ) Notice: Subject to any disclaimer, the term of this patent is extended or adjusted under 35 U.S.C. 154(b) by 176 days.

(21) Appl. No.: 13/911,995

(22) Filed: Jun. 6, 2013

(65) Prior Publication Data
US 2014/0055893 A1 Feb. 27, 2014

(30) Foreign Application Priority Data

Aug. 23, 2012 (TW) .............................. 101216260 U

(51) Int. Cl.
*H02H 1/00* (2006.01)
*H02H 3/20* (2006.01)

(52) U.S. Cl.
CPC .................................... *H02H 3/20* (2013.01)
USPC ........................................ 361/56; 361/212

(58) Field of Classification Search
USPC ............................................ 361/56, 212, 220
See application file for complete search history.

(56) References Cited

U.S. PATENT DOCUMENTS 8,068,189 B2 * 11/2011 Ichikawa ........................ 349/40
2011/0043954 A1 * 2/2011 Chuang et al. .................. 361/56

* cited by examiner

*Primary Examiner* — Danny Nguyen
(74) *Attorney, Agent, or Firm* — Muncy, Geissler, Olds & Lowe, P.C.

(57) ABSTRACT

A display and an electrostatic discharge protection apparatus are disclosed, wherein the display includes a display module, a flex flat cable, a motherboard, and an electrostatic discharge protection apparatus. The flex flat cable is electrically connected with the display module and the motherboard; the electrostatic discharge protection apparatus is disposed between the flex flat cable and the display module. The electrostatic discharge protection apparatus has an isolation board and at least one isolation pad, the isolation board includes a first surface and a second surface, and at least one part of the first surface is attached to the flex flat cable; the isolation pad comprises a first isolation surface, and the first isolation surface is combined with the second surface.

20 Claims, 3 Drawing Sheets

DISPLAY AND ELECTROSTATIC DISCHARGE PROTECTION APPARATUS

FIELD

The exemplary embodiment of the present invention relates to an electrostatic discharge protection apparatus for protecting a flex flat cable from an external electrostatic discharge, and a display having the electrostatic discharge protection apparatus aforementioned.

BACKGROUND

A very thin metal conducting layer made by compressing a flat copper wire is disposed in a flex flat cable, and isolation layers are respectively disposed on the upper surface and the lower surface of the metal conducting layer. The front and back connecting ends of the metal conducting layer are exposed outward, and thus the flex flat cable has a signal transmitting function. The flex flat cable is bendable and has good signal transmitting ability, so the flex flat cable is broadly used in electronic products.

Flex flat cables are also broadly used in liquid crystal displays. Flex flat cables are used as the interfaces for transmitting low voltage differential signaling (LVDS) in liquid crystal displays, and thus signals can be transmitted between a system end and a display module. The low voltage differential signaling is very sensitive to the external electrostatic discharge, such that when the flex flat cable is affected by the external electrostatic discharge, an error is generated in the transmitted low voltage differential signaling, and as a result the liquid crystal display system will cease to function properly, causing some inconvenience to the user. However, in recent manufacturing techniques and research, only the metal conducting layer situated inside the flex flat cable is protected from electrostatic discharge or provided with EMI disturbance protection or suppression; there is no solution to the problem of the flex flat cable being affected by the external electrostatic discharge.

Therefore, it is necessary to provide an electrostatic discharge protection apparatus to solve the problem of the flex flat cable being affected by the external electrostatic discharge.

SUMMARY

It is an object of the present invention to provide an electrostatic discharge protection apparatus to prevent a flex flat cable from being affected by an external electrostatic discharge.

Another main object of the present invention is to provide a display having the aforementioned electrostatic discharge protection apparatus.

To achieve the above object, the electrostatic discharge protection apparatus of the present invention comprises an isolation board and at least one isolation pad, wherein the isolation board comprises a first surface and a second surface. The first surface is attached to the flex flat cable to support the flex flat cable and increase the stiffness of the flex flat cable; the at least one isolation pad comprises a first isolation surface, and at least one part of the first isolation surface is combined with the second surface of the isolation board to support the isolation board and separate the isolation board from an object generating electrostatic discharge with a predetermined distance.

According to one embodiment of the present invention, a backing adhesive is disposed on the first surface, and the backing adhesive is used for attaching the isolation board to the flex flat cable; the isolation board is made of a plastic material without chlorine.

According to one embodiment of the present invention, the isolation board is made of polyethylene terephthalate (PET).

According to one embodiment of the present invention, the isolation board is made of polyethylene (PE).

According to one embodiment of the present invention, the at least one isolation pad has a thickness of no less than 4 mm.

According to one embodiment of the present invention, an interval between each isolation pad is 8 cm.

According to one embodiment of the present invention, the object is a metal component and the isolation pad is used for separating the metal component from the flex flat cable.

The present invention further provides a display, which comprises a display module, a flex flat cable, a motherboard and an electrostatic discharge protection apparatus. The flex flat cable is electrically connected with the display module and the motherboard for signal transmitting. The electrostatic discharge protection apparatus is disposed between the flex flat cable and the display module, and the electrostatic discharge protection apparatus comprises an isolation board and at least one isolation pad, wherein the isolation board comprises a first surface and a second surface, and the first surface is attached to the flex flat cable to support the flex flat cable and increase the stiffness of the flex flat cable; the at least one isolation pad comprises a first isolation surface, and at least one part of the first isolation surface is combined with the second surface of the isolation board to support the isolation board and separate the isolation board from the display module with a predetermined distance.

According to one embodiment of the present invention, the at least one isolation pad further comprises a second isolation surface, wherein an adhesive layer is disposed on the second isolation surface, and the second isolation surface is combined with the back surface of the display module via the adhesive layer.

According to one embodiment of the present invention, a backing adhesive is disposed on the first surface, and the backing adhesive is used for attaching the isolation board to the flex flat cable; the isolation board is made of a plastic material without chlorine.

According to one embodiment of the present invention, the isolation board is made of polyethylene terephthalate (PET).

According to one embodiment of the present invention, the isolation board is made of polyethylene (PE).

According to one embodiment of the present invention, the at least one isolation pad has a thickness of no less than 4 mm.

According to one embodiment of the present invention, an interval between each isolation pad is 8 cm.

According to one embodiment of the present invention, the back surface of the display module comprises a metal component, and the isolation pad is used for separating the metal component from the flex flat cable.

The present invention has a novel structure and is practicable in the industry; furthermore, the present invention does have an improved function, and thus it merits a patent per US patent laws.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

DETAILED DESCRIPTION

For facilitating understanding and clarifying the object, characteristics, and advantages of the present invention, the following specific embodiments and figures of the present invention are presented to provide a detailed description.

Following please refer to FIG. 1 to FIG. 4, which are related to embodiments of the display and the electrostatic discharge protection apparatus according to the present invention.

Figure 1:
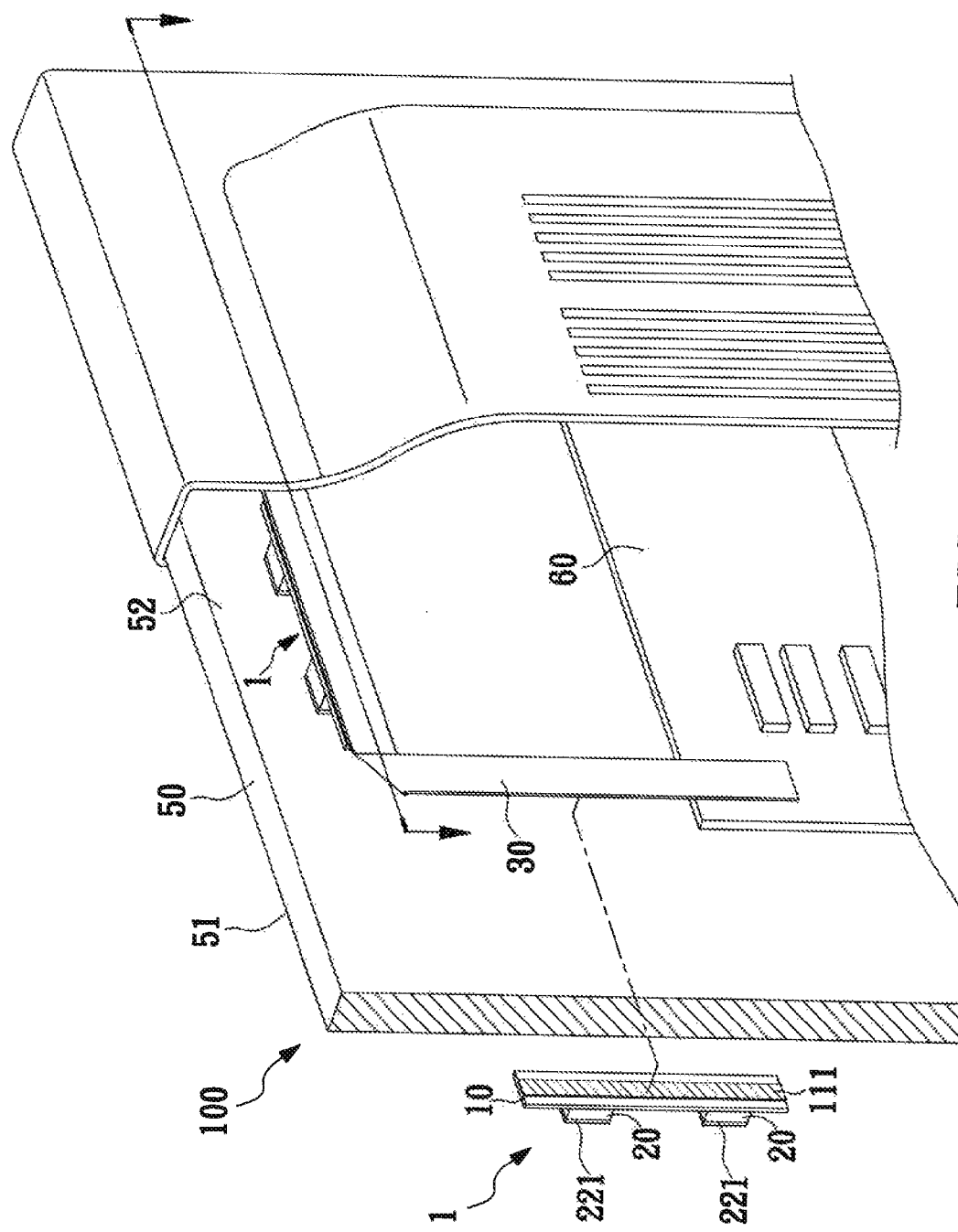
FIG. 1 is a schematic diagram of a combination of a display and an electrostatic discharge protection apparatus according to an exemplary embodiment of the present invention.

As shown in FIG. 1, the display 100 of the present embodiment is a liquid crystal display, and the display 100 comprises an electrostatic discharge protection apparatus 1, a flex flat cable 30, a display module 50, and a motherboard 60. The flex flat cable 30 is electrically connected with and between the display module 50 and the motherboard 60 for signal transmitting. In the present embodiment, one end of the flex flat cable 30 connects to a driver IC circuit board of the display module 50, and the other end of the flex flat cable 30 connects to the motherboard 60. The electrostatic discharge protection apparatus 1 is disposed between the flex flat cable 30 and the display module 50, and the electrostatic discharge protection apparatus 1 is attached to the flex flat cable 30 and the display module 50 respectively to protect the flex flat cable 30 from being affected by the external electrostatic discharge, and further to ensure the signal transmitting stability of the flex flat cable 30, thereby making the display 100 work normally.

As shown in FIG. 1, the flex flat cable 30 is elongated, and for being successfully disposed in the display 100, the flex flat cable 30 can be bent or folded up to match up the usable space and bypass other electronic components in the display 100. In the present embodiment, the flex flat cable 30 is used to transmit the low voltage differential signaling (LVDS) from the motherboard 60 to the driver IC circuit board of the display module 50. These signals are sensitive to the electrostatic discharge, and the design of the electrostatic discharge protection apparatus 1 can prevent the flex flat cable 30 from being affected by the external electrostatic discharge, and thereby ensuring the LVDS can be transmitted normally.

As shown in FIG. 1, the display module 50 is a liquid crystal display module, and the display module 50 comprises a displaying surface 51 and a back surface 52 opposite to the displaying surface 51, and the electrostatic discharge protection apparatus 1 is connected with the back surface 52 of the display module 50. In the present embodiment, the back surface 52 of the display module 50 is an iron component (or a metal component), and the surface of the iron component is the most likely place where electrostatic discharge may accumulate, and thus the flex flat cable 30 located here is easily affected by the electrostatic discharge. Therefore, if the flex flat cable 30 directly touches the back surface 52, or the interval between the flex flat cable 30 and the back surface 52 is too small, or there is no obstruction between the flex flat cable 30 and the back surface 52, the flex flat cable 30 will be affected by the electrostatic discharge accumulated on the back surface 52, and thus an error will be generated in signal transmitting and cause the display 100 to fail to function. When the electrostatic discharge protection apparatus 1 is installed, the flex flat cable 30 will not directly touch the back surface 52 of the display module 50 (the iron component), and an appropriate obstruction can be established so as to prevent the flex flat cable 30 from being affected by the external electrostatic discharge.

Figure 2:
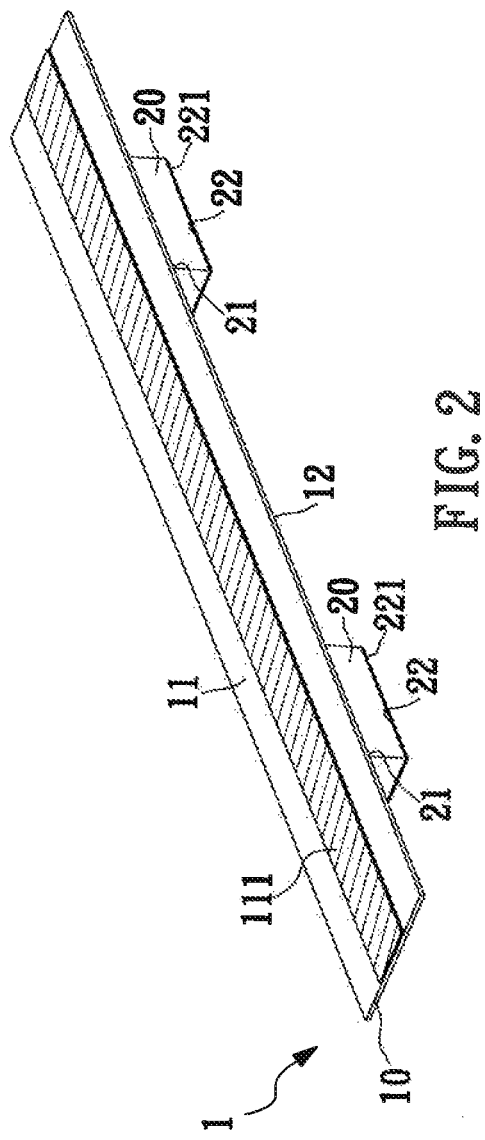
FIG. 2 is a schematic diagram of the electrostatic discharge protection apparatus according to an exemplary embodiment of the present invention.
Figure 3:
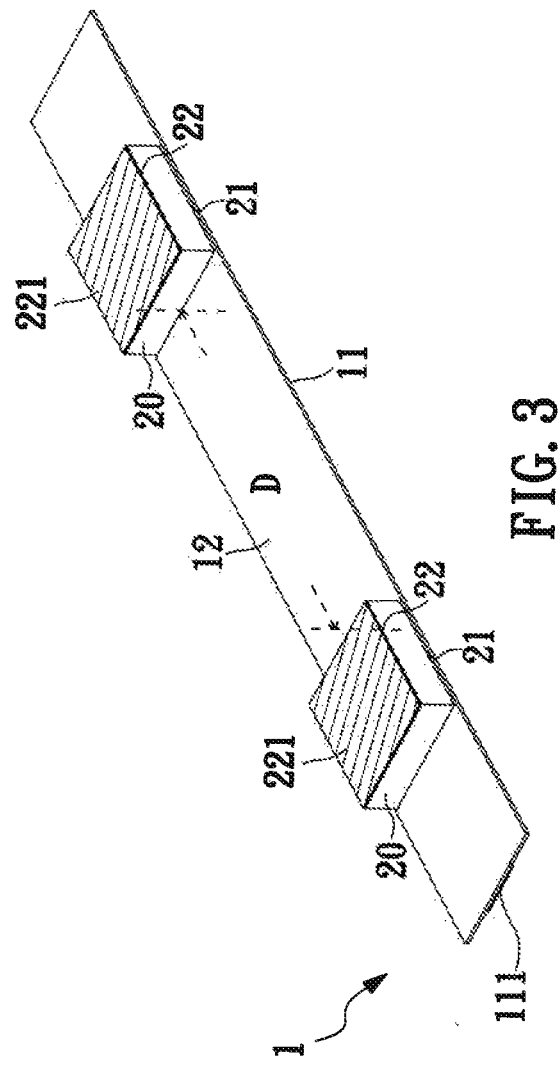
FIG. 3 is a bottom schematic diagram of the electrostatic discharge protection apparatus according to an exemplary embodiment of the present invention.

As shown in FIG. 2 and FIG. 3, in the present embodiment, the electrostatic discharge protection apparatus 1 comprises an isolation board 10 and two isolation pads 20, and the electrostatic discharge protection apparatus 1 is used to prevent the flex flat cable 30 from being affected by the external electrostatic discharge. The isolation board 10 of the present embodiment is an isolated plastic sheet, which is generally called Mylar. The length/width/thickness of the isolation board 10 are respectively 160 mm/30 mm/0.5 mm in the present embodiment. The common Mylar is made of polyethylene terephthalate (PET), but the present invention is not limited to the above material. The isolation board 10 could be composed of any suitable materials such as polyethylene (PE), Polypropylene (PP) or phenolic resins, which are isolated plastic materials without chlorine in their chemical molecular formula, and thus it can be ensured that no chlorine will be released due to the high temperature when the display 100 is working, thereby meeting safety requirements.

As shown in FIG. 2 and FIG. 3, the isolation board 10 comprises a first surface 11 and a second surface 12, and a backing adhesive 111 having a width of about 10 mm and a length about equal to the length of the isolation board 10 is disposed on the first surface 11. The backing adhesive 111 allows at least one part of the first surface 11 of the isolation board 10 to be attached to the flex flat cable 30 (as shown in FIG. 1), and thus the isolation board 10 can support the flex flat cable 30 and increase the stiffness of the flex flat cable 30 so as to prevent the LVDS transmitted in the flex flat cable 30 from being affected by the electrostatic discharge accumulated on the iron component due to the soft flex flat cable 30 being bent down and then touching the back surface 52 (the iron frame) of the display module 50, or the gap between the flex flat cable 30 and the back surface 52 is insufficient. It must be noted here that in order to steadily support the flex flat cable 3, the stiffness of the isolation board 10 should greater than the stiffness of the flex flat cable 30.

As shown in FIG. 3, the isolation pad 20 comprises a first isolation surface 21 and a second isolation surface 22, wherein at least one part of the first isolation surface 21 is attached to the second surface 12 of the isolation board 10 to support the isolation board 10, and further separates the isolation board 10 from an object generating electrostatic discharge with a predetermined distance. In the present embodiment, the object generating electrostatic discharge is the metal component on the back surface 52 of the display module 50, and the predetermined distance can be changed according to the demands for electrostatic discharge protection required by the flex flat cable 30.

Figure 4:
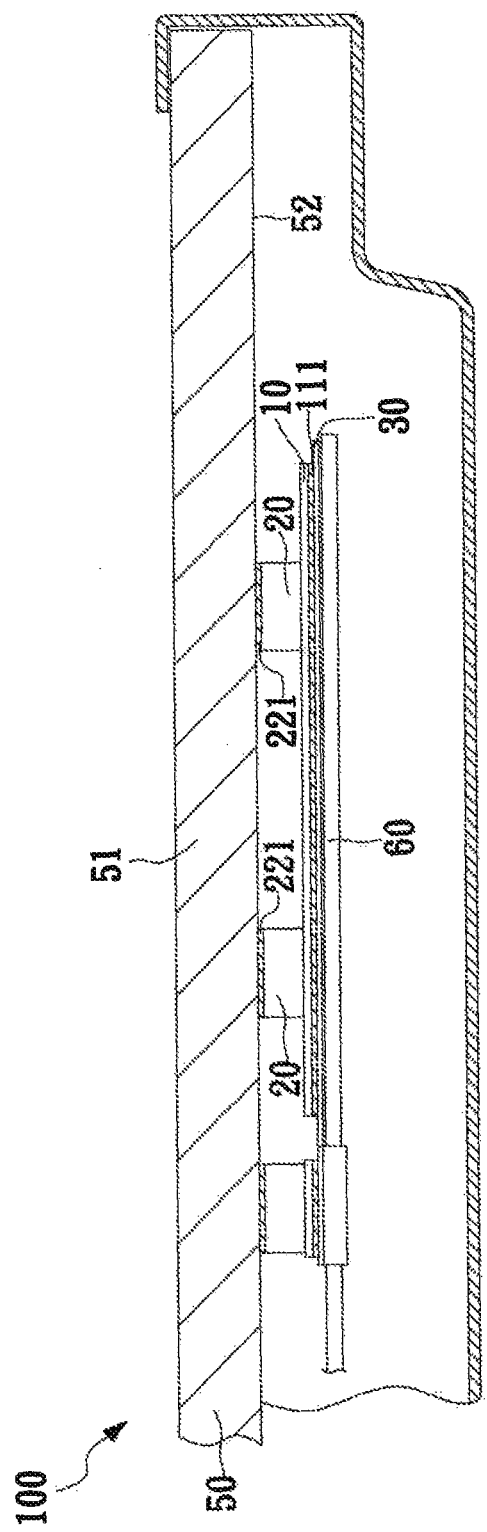
FIG. 4 is a cross-section schematic diagram of FIG. 1.

The second isolation surface 22 can be attached to the back surface 52 of the display module 50 via the adhesive layer 221 (as shown in FIG. 1 and FIG. 4). In the present embodiment, two isolation pads 20 are both foam and have a 4 mm thickness, and an interval between two isolation pads is 8 cm, and thus a 4 mm interval between the flex flat cable 30 and the back surface 52 is maintained (as shown in FIG. 4), thereby increasing the level of electrostatic discharge protection of the flex flat cable 30.

As shown in FIG. 4, it has been proved by experiments that when the thickness of the isolation pad 20 is 4 mm, the electrostatic discharge protection level of the flex flat cable 30 can be increased to 15K, but the thickness of the present invention is not limited to this example; the thickness of the isolation pad 20 can be changed to satisfy different internal assembling rules of different display manufacturers. If the internal assembling rule of one display manufacturer allows the electrostatic discharge protection level of the flex flat cable 30 to be less than 15K, then the thickness of the isolation pad 20 can be less than 4 mm; if the internal assembling rule of one display manufacturer states that the electrostatic discharge protection level of the flex flat cable 30 should be equal to or higher than 15K, then the thickness of the isolation pad 20 can be equal to or higher than 4 mm. Besides, in addition to maintaining a gap between the flex flat cable 30 and the back surface 52 by the isolation pad 20 to increase the electrostatic discharge protection level, the isolation characteristics of the isolation board 10 provide a second level of electrostatic discharge protection to the flex flat cable 30.

Please refer back to FIG. 1; it must be noted here that the electrostatic discharge protection apparatus 1 of the present invention is disposed between the flex flat cable 30 and the back surface 52 (the iron component) of the display module 50, and this is the most likely location where the flex flat cable 30 would be affected by the external electrostatic discharge. The design of the electrostatic discharge protection apparatus 1 can protect the flex flat cable 30 from being affected by the external electrostatic discharge (the electrostatic discharge accumulated on the back surface 52) and ensure the stability of transmitting the LVDS in the flex flat cable 30.

In addition, as shown in FIG. 1, the number of the electrostatic discharge protection apparatuses 1 could be adjusted according to the length and shape of the flex flat cable 30. When assembling the electrostatic discharge protection apparatus 1, it would be appropriate to adhere each electrostatic discharge protection apparatus 1 on the flex flat cable 30. In addition, the length, width, thickness of the isolation board 10 and the number of the isolation pads 20 combined with a single isolation board 10 can be changed depending on the demands of real design, and the present invention is not limited to the aforementioned embodiments.

It must be noted that the above-mentioned embodiments are only for illustration. It is intended that the disclosure cover modifications and variations of this disclosure provided that they fall within the scope of the following claims and their equivalents. Therefore, it will be apparent to those skilled in the art that various modifications can be made to the structure of the disclosure without departing from the scope or spirit of the disclosure.

What is claimed is:

1. A display, comprising:
   a display module;
   a motherboard;
   a flex flat cable, electrically connected with the display module and the motherboard, for signal transmitting;
   an electrostatic discharge protection apparatus, disposed between the flex flat cable and the display module, comprising:
     an isolation board, comprising a first surface and a second surface, wherein at least one part of the first surface is attached to the flex flat cable to support the flex flat cable and increase the stiffness of the flex flat cable; and
     at least one isolation pad, comprising a first isolation surface, at least one part of the first isolation surface being combined with the second surface of the isolation board to support the isolation board and separate the isolation board from the display module with a predetermined distance.

2. The display as claimed in claim 1, wherein the at least one isolation pad further comprises a second isolation surface combined with a back surface of the display module.

3. The display as claimed in claim 1, wherein a backing adhesive is disposed on the first surface and the backing adhesive is used for attaching the isolation board to the flex flat cable.

4. The display as claimed in claim 2, wherein an adhesive layer is disposed on the second isolation surface and the second isolation surface is combined with the back surface of the display module via the adhesive layer.

5. The display as claimed in claim 1, wherein the at least one isolation pad has a thickness of no less than 4 mm.

6. The display as claimed in claim 1, wherein the number of the at least one isolation pads is at least two.

7. The display as claimed in claim 1, wherein the isolation board is made of a plastic material without chlorine.

8. The display as claimed in claim 7, wherein the isolation board is made of polyethylene terephthalate (PET).

9. The display as claimed in claim 7, wherein the isolation board is made of polyethylene (PE).

10. The display as claimed in claim 6, wherein an interval between each isolation pad is 8 cm.

11. The display as claimed in claim 2, wherein the back surface of the display module comprises a metal component and the isolation pad is used for separating the metal component from the flex flat cable.

12. An electrostatic discharge protection apparatus, adapted for a flex flat cable, comprising:
    an isolation board, including a first surface and a second surface, wherein at least one part of the first surface is attached to the flex flat cable to support the flex flat cable and increase the stiffness of the flex flat cable; and
    at least one isolation pad, comprising a first isolation surface, at least one part of the first isolation surface being combined with the second surface of the isolation board to support the isolation board and separate the isolation board from an object generating electrostatic discharge with a predetermined distance.

13. The electrostatic discharge protection apparatus as claimed in claim 12, wherein a backing adhesive is disposed on the first surface and the backing adhesive is used for attaching the isolation board to the flex flat cable.

14. The electrostatic discharge protection apparatus as claimed in claim 12, wherein the at least one isolation pad has a thickness of no less than 4 mm.

15. The electrostatic discharge protection apparatus as claimed in claim 12, wherein the number of the at least one isolation pads is at least two.

16. The electrostatic discharge protection apparatus as claimed in claim 12, wherein the isolation board is made of a plastic material without chlorine.

17. The electrostatic discharge protection apparatus as claimed in claim 16, wherein the isolation board is made of polyethylene terephthalate (PET).

18. The electrostatic discharge protection apparatus as claimed in claim 16, wherein the isolation board is made of polyethylene (PE).

19. The electrostatic discharge protection apparatus as claimed in claim 15, wherein an interval between each isolation pad is 8 cm.

20. The electrostatic discharge protection apparatus as claimed in claim 12, wherein the object is a metal component and the isolation pad is used for separating the metal component from the flex flat cable.

* * * * *